United States Patent [19]
Kaneno et al.

[11] Patent Number: 5,782,979
[45] Date of Patent: Jul. 21, 1998

[54] SUBSTRATE HOLDER FOR MOCVD

[75] Inventors: Nobuaki Kaneno; Hirotaka Kizuki; Masayoshi Takemi; Kenzo Mori, all of Itami, Japan

[73] Assignee: Mitsubishi Denki Kabushiki Kaisha, Tokyo, Japan

[21] Appl. No.: 489,773

[22] Filed: Jun. 13, 1995

Related U.S. Application Data

[62] Division of Ser. No. 189,837, Feb. 1, 1994, abandoned.

[30] Foreign Application Priority Data

Apr. 22, 1993 [JP] Japan ............................ 5-095727

[51] Int. Cl.$^6$ .................................................. C23C 16/00
[52] U.S. Cl. .......................... 118/500; 118/715; 118/725; 118/728
[58] Field of Search ............................. 118/715, 725, 118/728, 500

[56] References Cited

U.S. PATENT DOCUMENTS

| | | | |
|---|---|---|---|
| 3,783,822 | 1/1974 | Wollam | 118/49.1 |
| 4,074,305 | 2/1978 | Johnston, Jr. et al. | 357/67 |
| 4,284,033 | 8/1981 | del Rio | 118/730 |
| 4,860,687 | 8/1989 | Frijlink | 118/730 |
| 4,877,573 | 10/1989 | Nilsson | 156/610 |
| 4,961,399 | 10/1990 | Frijlink | 118/730 |
| 4,975,299 | 12/1990 | Mir et al. | 427/51 |
| 4,993,357 | 2/1991 | Scholz | 118/730 |
| 5,027,746 | 7/1991 | Frijlink | 118/730 |
| 5,226,383 | 7/1993 | Bhat | 118/730 |

FOREIGN PATENT DOCUMENTS

| | | | |
|---|---|---|---|
| 362952 | 4/1990 | European Pat. Off. . | |
| 117143 | 6/1974 | Germany . | |
| 51-123588 | 10/1976 | Japan . | |
| 61-287219 | 12/1986 | Japan . | |
| 63-147894 | 12/1986 | Japan . | |
| 62-85423 | 4/1987 | Japan . | |
| 62-260316 | 11/1987 | Japan | 118/730 |
| 63-236313 | 10/1988 | Japan . | |
| 1206618 | 8/1989 | Japan . | |
| 3-159225 | 7/1991 | Japan | 118/730 |
| 426586 | 1/1992 | Japan . | |
| 4-313220 | 11/1992 | Japan | 118/730 |
| 1768675 | 10/1992 | U.S.S.R. | 118/730 |
| 2206608 | 4/1988 | United Kingdom . | |

OTHER PUBLICATIONS

Woelk, J. Crystal Growth, 93 (1988) 216–219.
Frijlink, "A New Versatile, large Size MOVPE Reactor", Journal of Crystal Growth, vol. 93, 1988, pp. 207–215.
Cureton et al, "Lateral and Vertical Composition Control in MOCVD–Grown InP/GaInAs(P) Structures", Journal of Crystal Growth, vol. 107, 1991, pp. 549–554.

*Primary Examiner*—Richard Bueker
*Attorney, Agent, or Firm*—Leydig, Voit & Mayer

[57] ABSTRACT

A substrate holder employed for MOCVD and supporting a wafer on which crystal growth proceeds includes a molybdenum holder body, a GaAs polycrystalline film with a flat surface grown on a part of the surface of the molybdenum holder body where the wafer is absent, and an InP polycrystalline film grown on the GaAs polycrystalline film. Each of the polycrystalline films is grown to a thickness of 0.3 μm or more at a temperature higher than the epitaxial growth temperature of 575° C. During the MOCVD process, the emissivity of the molybdenum substrate holder is stable at a value near the emissivity of the wafer on the substrate holder and, therefore, the decomposition ratio of $PH_3$ gas on the substrate holder is stable at a value near the decomposition ratio on the wafer, whereby any variation of the incorporation ratio of P atoms in the grown InGaAsP, i.e., a variation of the composition of the InGaAsP, is reduced and run-to-run variations of the composition of the grown crystal are reduced.

2 Claims, 14 Drawing Sheets

Fig. 5 (a) (Prior Art)
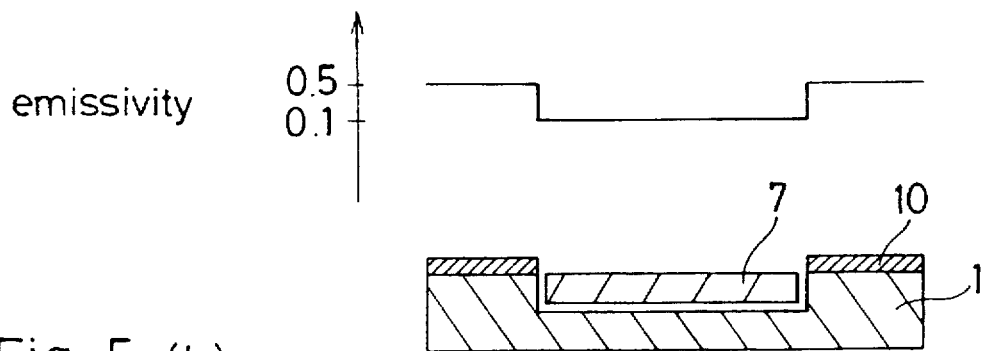
Fig. 5 (b)
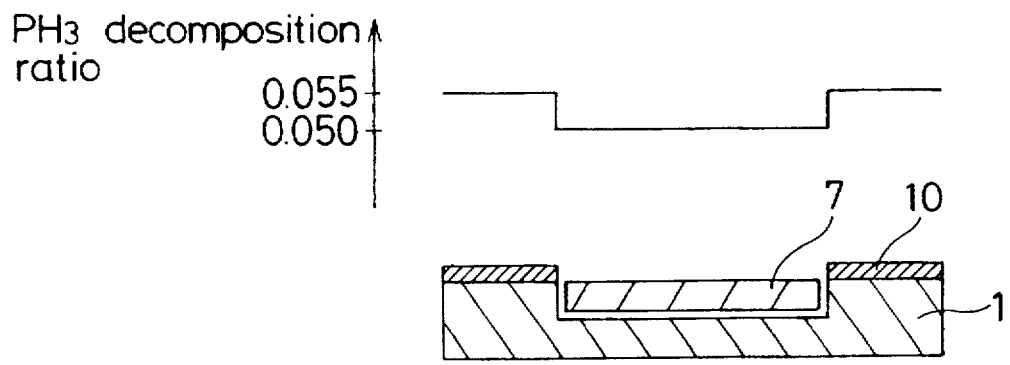
Fig. 6 (Prior Art)
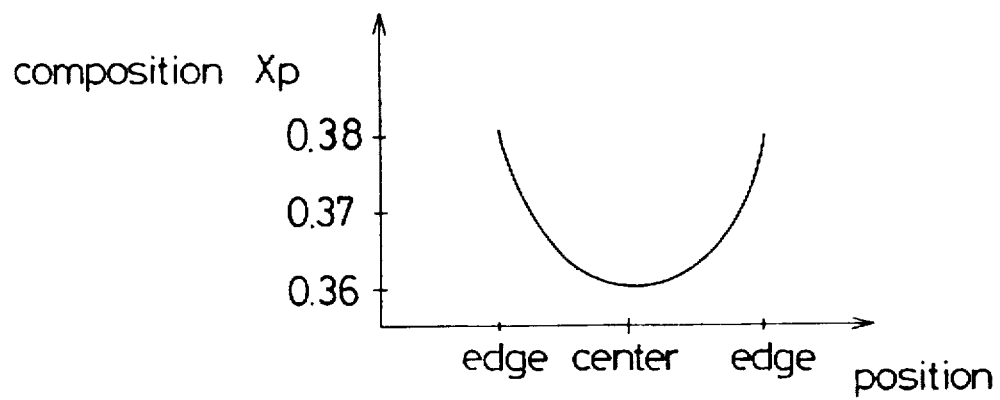

SUBSTRATE HOLDER FOR MOCVD

This disclosure is a division of patent application Ser. No. 08/189,837, filed Feb. 1, 1994 now abandoned.

FIELD OF THE INVENTION

The present invention relates to a substrate holder for MOCVD (Metal Organic Chemical Vapor Deposition) and, more particularly, to a substrate holder that provides a uniform crystal growth of compound semiconductor. The invention also relates to an MOCVD apparatus including a high-speed rotating susceptor supporting a plurality of wafers and a mechanism for rotating the wafers on the susceptor.

BACKGROUND OF THE INVENTION

FIG. 11 is a sectional view illustrating a substrate holder included in a conventional MOCVD apparatus. In the figure, a substrate holder 1 comprising molybdenum (hereinafter referred to as molybdenum substrate holder) has a cavity 1a in the center of the front surface. A polycrystalline film 10 is disposed on a part of the front surface where the cavity 1a is absent. A semiconductor wafer 7 comprising InP or the like is mounted on the flat surface of the cavity 1a. A heater 9 for heating the wafer 7 is disposed beneath the substrate holder 1. The substrate holder 1 and the heater 9 are included in an MOCVD reactor.

A description is given of the operation.

The substrate holder 1 and the wafer 7 are heated to 600° C. by the heater 9. Source gases introduced into the reactor, such as $PH_3$ and $AsH_3$, are decomposed due to heat emitted from the substrate holder 1 or the wafer 7 and elements of those gases are epitaxially grown on the wafer 7. During the epitaxial growth, the polycrystalline film 10 is deposited on the part of the substrate holder 1 where the wafer 7 is absent.

The emissivity at the surface of the molybdenum (metal) substrate holder 1, i.e., the thermal conductivity from the surface of the substrate holder 1 to the source gas, is different from the emissivity at the surface of the InP compound semiconductor wafer 7. More specifically, the emissivity of the molybdenum substrate holder 1 is 0.3 and the emissivity of the InP wafer 7 is 0.1. In addition, the thickness of the polycrystalline film 10 deposited on the surface of the molybdenum substrate holder 1 increases with every crystal growth, and the polycrystalline film 10 further increases the emissivity, resulting in the emissivity of 0.5 at the surface of the molybdenum substrate holder 1 as shown in FIG. 5(a). Because of the difference in emissivities between the molybdenum substrate holder 1 and the InP wafer 7, the decomposition ratio of the $PH_3$ gas on the molybdenum substrate holder 1 is different from that on the InP wafer 7, i.e., the former is 0.055 while the latter is 0.050 as shown in FIG. 5(b). Therefore, the incorporation ratio of P atoms in an InGaAsP layer ($In_{0.71}Ga_{0.29}As_{1-x}P_x$) grown on the wafer 7 significantly varies between the center part and the edge part of the wafer, with the result that the composition of the InGaAsP layer grown on the wafer significantly varies as shown in FIG. 6. FIG. 7 illustrates a photoluminescence wavelength profile in the InGaAsP layer grown on the wafer 7.

When an InP polycrystalline film 3 is epitaxially grown on a molybdenum layer 1 at the ordinary epitaxial growth temperature of 575°–675° C. as shown in FIG. 8, the growth proceeds on an uneven surface, i.e., a three-dimensional growth is carried out. The emissivity at the surface of the molybdenum layer 1 in contact with the source gas does not level off but changes for each growth step.

In a crystal growth step employing a source gas having a large dependence of decomposition ratio on temperature, such as $PH_3$, the decomposition ratio of the source gas varies with the temperature rise during the growth process. Therefore, when a mixed crystal including two kinds of group V elements, such as an InGaAsP crystal, is grown, the run-to-run variation of the composition of the grown layer is significantly increased.

Japanese Published Patent Application No. 1-206618 discloses an MOCVD apparatus that improves the uniformity of the composition of the grown layer. In this prior art publication, a mixed crystal semiconductor layer, such as an InGaAsP layer, and a compound semiconductor layer, such as a GaAs layer, are epitaxially grown on an InP substrate disposed on a graphite susceptor. The graphite susceptor is heated to 630° C. by high frequency induction heating, and $H_2$ is employed as a carrier gas. A plurality of InP dummy layers are disposed around the InP substrate, whereby the epitaxial growth proceeds with uniform crystallinity and composition of the layer grown on the InP substrate.

Meanwhile, Journal of Crystal Growth 107 (1991), pp.549–554 discloses a lateral and vertical composition control in MOCVD-grown InP/GaInAs(P) structures. If $AsH_3$ is employed as a source gas, it is possible to make the decomposition ratio of the $AsH_3$ gas uniform by adjusting the temperature profile of the susceptor. In a Thomas Swan MOCVD apparatus, however, when the $AsH_3$ gas required for the growth of the lower GaInAs layer is exchanged for the $PH_3$ gas needed to grow the upper InP layer, an imperfect gas switching produces an uneven surface of the lower GaInAs layer that adversely affects the uniformity of the crystal composition in the upper InP layer. In this MOCVD apparatus, in order to solve the above-described problem, hydrogen is added to the gas stream in the reactor in the direction opposite to the gas stream at the instant of source gas switching, whereby the $AsH_3$ gas used for growing the lower GaInAs layer is completely eliminated. Thereafter, the $PH_3$ gas for growing the upper InP layer is introduced into the reactor. Since the thickness of the lower GaInAs layer is uniform, the uniformity of the composition of the InP/GaInAs structure is improved.

Meanwhile, Japanese Published Patent Application No. 4-26586 discloses a substrate holder for MBE (Molecular Beam Epitaxy) that reduces the variation in the emissivity at the surface of the substrate holder. In this prior art publication, an indium plated holder or an indium free holder is employed. A substrate mounted on the holder is heated with a heater from the rear surface. A molecular beam is incident on the front surface of the substrate. A tantalum nitride (TiN) film or a graphite film is formed on the entire surface of the substrate holder irradiated with the molecular beam or on selected portions of the surface to settle the temperature of the substrate on the holder, whereby the emissivity of the substrate holder before the crystal growth is brought close to 0.5 which is the emissivity of the holder after the crystal growth, whereby the variation in the emissivity of the substrate holder during the crystal growth is reduced.

However, in the conventional MOCVD apparatus employing the molybdenum substrate holder, the composition distribution in the InGaAsP mixed crystal layer grown on the wafer is not uniform. In addition, the composition of the mixed crystal layer and the composition distribution in the mixed crystal layer unfavorably vary during every crystal growth step.

FIGS. 19(a) and 19(b) illustrate a conventional high-speed rotating disk susceptor with a substrate holder, in which FIG. 19(a) is a plan view and FIG. 19(b) is a sectional view taken along line A–A' of FIG. 19(a). The susceptor with the substrate holder is contained in an MOCVD reactor. The direction of gas flow on the susceptor is illustrated in FIGS. 20(a) and 20(b).

In the figures, a plurality of wafers 400 are disposed on a substrate holder 300a. The substrate holder 300a is disposed on a susceptor 200a. A rotation axle 100 supports the susceptor 200a. Reference numeral 500 designates a reactor.

A description is given of the operation.

Initially, wafers 400 are put on the substrate holder 300a and the substrate holder 300a is put on the susceptor 200a. The susceptor 200a with the substrate holder 300a is rotated by the rotation axle 100 which is connected to a motor (not shown) at a desired speed, for example, 1000 rpm.

When the susceptor 200a is rotated at a high speed, exceeding 500 rpm, the gas 90 introduced into the reactor 500, such as $AsH_3$, TMG (Trimethyl Gallium), or $H_2$, flows as shown in FIGS. 20(a) and 20(b). That is, the gas 90 perpendicularly applied to the center of the substrate holder 300a flows radially toward the edge of the substrate holder 300a and parallel to the surface of the substrate holder while whirling with the rotation of the substrate holder. The maximum flow rate of the gas 90 is 60 cm/sec.

When a GaAs layer is grown on each wafer 400, $H_2$ gas and $AsH_3$ gas are introduced into the reactor when the rotating speed of the susceptor 200a reaches 1000 rpm. The susceptor 200a is heated at a desired temperature, for example, 700° C., by resistance heating, lamp heating, or RF heating. The growth of the GaAs layer starts when TMG gas is added to the gas stream in the reactor.

FIG. 21 illustrates the temperature gradient on the susceptor 200a during the growth of the GaAs layer. The temperature in the vicinity of the edge of the susceptor is higher than the temperature in the center. That is, the heat applied to the source gas flow 90 gradually increases in the downstream direction of the source gas flow, resulting in a difference in the decomposition ratios of the source gas between the upstream part and the downstream part of the source gas flow, which causes variations in thickness, composition, and carrier density of a crystal layer grown on the wafer 400.

Various methods and apparatus for reducing the variations in the thickness and the composition have been proposed. Some of them will be described hereinafter.

FIG. 22 is a plan view illustrating an MOCVD apparatus disclosed in Japanese Published Patent Application No. 61-287219. In the figure, reference numeral 210 designates a susceptor. Three satellite stages 620 on which wafers are to be mounted and a main stage 310 are disposed on the susceptor 210. Each satellite stage 620 has a gear 610 in the center of its rear surface. The main stage 310 has a groove 340 in which a gear 320 is disposed. The gears 610 of the satellite stages 620 are engaged with the gear 320 of the main stage 310, and the main stage 310 is connected to a motor (not shown) via a rotation axle 110. In operation, the main stage 310 is rotated at a speed of 20 rpm. With the rotation of the main stage 310, the satellite stages 620 are rotated at a speed of several tens of rpm because the gears 610 are engaged with the gear 320. In this way, a wafer disposed on each satellite stage 620 turns on the gear 610 and revolves around the gear 320 of the main stage, resulting in a uniform thickness of a semiconductor layer grown on the wafer.

Japanese Published Patent Application No. 62-85423 discloses an MOVPE (Metal Organic Vapor Phase Epitaxy) apparatus in which a plurality of satellite stages, each one supporting a GaAs substrate, are disposed on a main stage. The main stage is disposed on a rotation axle. Gear teeth are formed in the periphery of each satellite stage. A thermocouple tube penetrates through the center of the main stage and the rotation axis, and a gear is fixed to an end of the thermocouple tube on the surface of the main stage. Since the fixed gear is engaged with the gears of the satellite stages, the satellite stages rotate with the rotation of the main stage. In this way, the GaAs substrate on the satellite stage turns on its axis and revolves around the fixed gear in the center of the main stage, resulting in uniform thickness and composition of a compound semiconductor layer grown on the GaAs substrate.

Another MOVPE apparatus is disclosed in Journal of Crystal Growth 93 (1988), pp.207–215. This MOVPE reactor includes a substrate support comprising a disk base, a main platform which turns around a main central axis, and seven satellite platforms, each one supporting a wafer and each one turning around its axis. The main platform as well as the satellite platforms are supported by an airfoil, which also provides the rotation. The basic principle of the airfoil rotation will be described. A disk (in this case, the main platform or the satellite platform) with a small axial hole in its lower flat surface covers another disk (the base or the main platform) with three shallow spiral grooves in its upper flat surface. Each spiral groove has a small hole in its end near the center of the disk, out of which a gas flows, coming from below. The lower disk also has a small hole in the center of its upper surface in which an axle is fitted, which centers th e upper disk, but does not support it. The gas flowing out of the three holes lifts and rotates the upper disk. This MOVPE apparatus provides uniform thickness and composition of a crystal layer grown on the wafer supported by a satellite platform.

However, if the rotation mechanism of the above-described MOVPE apparatus is applied to a susceptor of an MOCVD apparatus which rotates at a high speed of about 1000 rpm, the apparatus will break easily. If the number of wafers for the crystal growth is increased, the rotation mechanism is complicated, resulting in more troubles.

SUMMARY OF THE INVENTION

An object of the present invention is to provide a substrate holder for MOCVD that improves the uniformity of the composition distribution in an InGaAsP mixed crystal layer grown on a wafer supported by the substrate holder and that reduces the run-to-run variation in the composition of the InGaAsP layer.

Another object of the present invention is to provide an MOCVD apparatus with a high-speed rotating susceptor that provides improved rotation of a wafer disposed thereon, whereby a crystal layer with uniform thickness, composition, and carrier density over the wafer is attained regardless of the gas flow direction.

Other objects and advantages of the present invention will become apparent from the detailed description given hereinafter, it should be understood, however, that the detailed description and specific embodiment are given by way of illustration only, since various changes and modifications within the spirit and scope of the invention will become apparent to those skilled in the art from this detailed description.

According to a first aspect of the present invention, a molybdenum substrate holder employed in MOCVD for supporting a wafer on which crystal growth proceeds includes a GaAs polycrystalline film with a flat surface grown on a part of the surface of the substrate holder where the wafer is absent and an InP polycrystalline film grown on the GaAs polycrystalline film. Each of the polycrystalline films is grown to a thickness of 0.3 µm or more at a temperature higher than the epitaxial growth temperature of 575° C.

According to a second aspect of the present invention, a molybdenum substrate holder employed in MOCVD for supporting a wafer on which crystal growth proceeds includes an InGaAsP polycrystalline film with a flat surface grown on a part of the surface of the substrate holder where the wafer is absent. The InGaAsP polycrystalline film is grown to a thickness of 0.3 µm or more at a temperature higher than the epitaxial growth temperature of 575° C.

According to a third aspect of the present invention, the above-described molybdenum substrate holders further include an SiC film interposed between the front surface of the substrate holder and the GaAs polycrystalline film or the InGaAsP polycrystalline film.

According to a fourth aspect of the present invention, a molybdenum substrate holder employed in MOCVD for supporting a wafer on which crystal growth proceeds includes an InP polycrystalline film grown on a part of the surface of the substrate holder where the wafer is absent. The InP polycrystalline film is grown to a thickness of 0.3 µm or more at a temperature of 400°–550° C. that is lower than the epitaxial growth temperature of 575° C.

In the MOCVD process using one of the above-described molybdenum substrate holders, the emissivity of the molybdenum substrate holder is settled at a value near the emissivity of the wafer on the substrate holder and, therefore, the decomposition ratio of $PH_3$ gas on the substrate holder is settled at a value near the decomposition ratio on the wafer, whereby the variation of the incorporation ratio of P atoms in the InGaAsP mixed crystal, i.e., the variation of the composition of the InGaAsP mixed crystal, is reduced and the run-to-run variation of the composition of the mixed crystal is reduced.

According to a fifth aspect of the present invention, an MOCVD apparatus includes a high-speed rotatable susceptor having a plurality of small axle holes on its front surface, means for heating the susceptor, an inlet for supplying source gases in a direction perpendicular to the front surface of the susceptor, a substrate holder having a plurality of apertures and disposed on the front surface of the susceptor, and a plurality of wafer trays disposed on the front surface of the susceptor through the apertures of the substrate holder. Each wafer tray supports a wafer and has a plurality of wings on its periphery and a rotation axle in the center of its rear surface. The rotation axle is fitted in the axle hole of the susceptor. The source gases are applied to the wings of the wafer tray, whereby the wafer tray turns on the rotation axle.

According to a sixth aspect of the present invention, an MOCVD apparatus includes a high-speed rotatable susceptor, means for heating the susceptor, an inlet for supplying source gases in a direction perpendicular to the front surface of the susceptor, a substrate holder disposed on the surface of the susceptor and having a plurality of cavities, each cavity having a bearing mechanism on its upper flat surface, and a plurality of wafer trays. Each wafer tray has a plurality of wings on its periphery and is disposed on the upper flat surface of the cavity via the bearing mechanism. The source gases are applied to the wings of the wafer tray, whereby the wafer tray rotates on the bearing mechanism.

According to a seventh aspect of the present invention, an MOCVD apparatus includes a high-speed rotatable susceptor, means for heating the susceptor, an inlet for supplying source gases in a direction perpendicular to the front surface of the susceptor, a substrate holder disposed on the surface of the susceptor and having a plurality of cavities, each cavity having a small axle hole in the center of its upper flat surface and a bearing mechanism on the upper flat surface, and a plurality of wafer trays. Each wafer tray has a plurality of wings on its periphery and a rotation axle in the center of its rear surface. The wafer tray is disposed on the upper flat surface of the cavity of the substrate holder so that the rotation axle is fitted in the small axle hole and the rear surface of the wafer tray is in contact with the bearing mechanism. The source gases are applied to the wings of the wafer tray, whereby the wafer tray turns on the rotation axle.

According to an eighth aspect of the present invention, an MOCVD apparatus includes a high-speed rotatable susceptor, means for heating the susceptor, an inlet for supplying source gases in a direction perpendicular to the front surface of the susceptor, a substrate holder having a plurality of apertures and disposed on the front surface of the susceptor, a plurality of wafer trays disposed on the front surface of the susceptor via the apertures of the substrate holder. Each wafer tray has an axle in the center of its rear surface, which axle penetrates through the susceptor and reaches the rear surface of the susceptor, and a plurality of wings connected to the end of the axle on the rear surface of the susceptor. A gas supply pipe is arranged in the vicinity of the wings of the wafer tray on the rear surface of the susceptor and a gas is applied through the pipe to the wings, whereby the wafer tray rotates on the axle.

In the above-described MOCVD apparatus high-speed rotation of the susceptor provides the revolution of the wafers on the wafer trays around the axis of the susceptor and makes the residence time of the source gas on the wafers longer, whereby the decomposition ratio of the source gas is increased. The rotation of the wafer tray on its axle provides the rotation of each wafer, whereby the difference in the source gas decomposition ratios between the upstream part and the downstream part in the source gas flow is reduced. Since the position of the wafer relative to the source gas flow shifts all the time during the crystal growth, a crystal layer with uniform thickness, composition, and carrier density over the wafer is attained regardless of the direction of the source gas flow and the difference in the source gas decomposition ratios.

BRIEF DESCRIPTION OF THE DRAWINGS

FIG. 5(a) is a diagram illustrating a difference in emissivities between a substrate holder and a semiconductor mixed crystal substrate on the holder and FIG. 5(b) is a diagram illustrating a difference in source gas decomposition ratios between the substrate holder and the substrate, according to the prior art.

FIG. 6 is a diagram illustrating a composition distribution profile of a semiconductor mixed crystal layer grown on the substrate of FIGS. 5(a)–5(b).

DETAILED DESCRIPTION OF THE PREFERRED EMBODIMENTS

Figure 1:
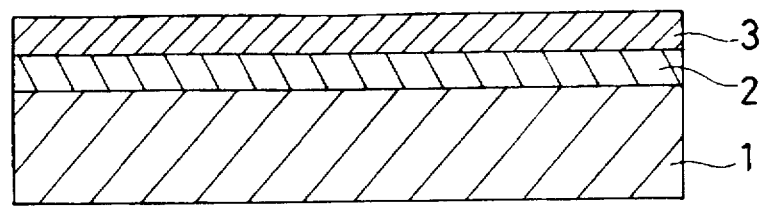
FIG. 1 is a sectional view illustrating a substrate holder of an MOCVD apparatus in accordance with a first embodiment of the present invention.

FIG. 1 is a sectional view illustrating a part of a molybdenum substrate holder for MOCVD other than a part where a wafer is mounted, in accordance with a first embodiment of the present invention.

In FIG. 1, reference numeral 1 designates a molybdenum substrate holder. A GaAs polycrystalline film 2 having a thickness of 0.3 µm or more is disposed on the substrate holder 1, and an InP polycrystalline film 3 having a thickness of 0.3 µm or more is disposed on the film 2.

A description is given of the production process.

Initially, GaAs is grown on the surface of the molybdenum substrate holder 1 except a wafer mounting part, to a thickness of 0.3 µm or more, forming the GaAs polycrystalline film 2 and, successively, InP is grown on the GaAs polycrystalline film 2 to a thickness of 0.3 µm or more, forming the InP polycrystalline film 3. The growth is carried out at the ordinary epitaxial growth temperature, i.e., 575°–675° C.

Figure 8:
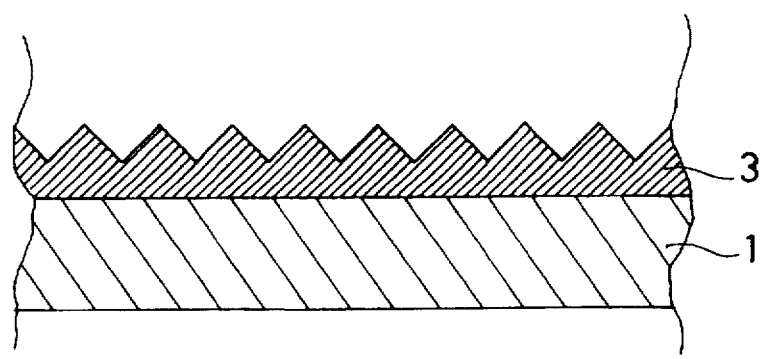
FIG. 8 is a sectional view illustrating an InP polycrystalline film grown on a substrate supported by the substrate holder according to the prior art.
Figure 9:
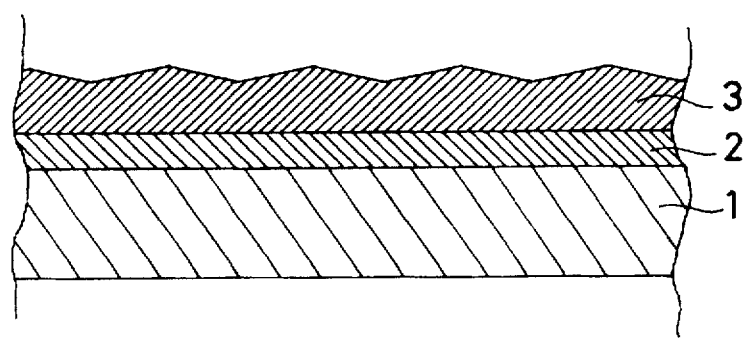
FIG. 9 is a sectional view illustrating an InP polycrystalline film grown on a substrate supported by the substrate holder of FIG. 1 according to the first embodiment of the present invention.
Figure 10:
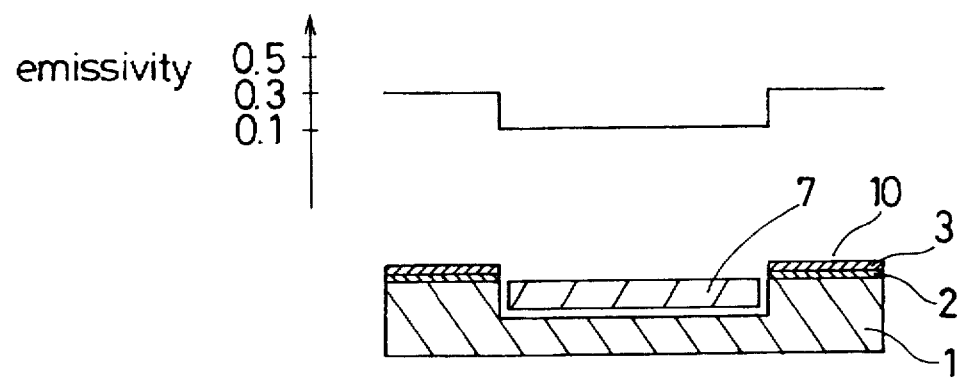
FIG. 10 is a diagram illustrating a difference in emissivities between the substrate holder of FIG. 1 and a semiconductor mixed crystal substrate supported by the holder.
Figure 11:
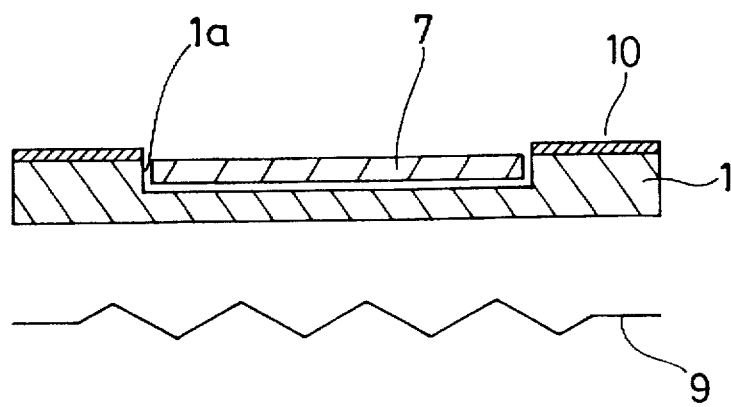
FIG. 11 is a sectional view schematically illustrating a substrate holder according to the prior art.

When the InP polycrystalline film 3 is directly grown on the surface of the molybdenum substrate holder 1 at the temperature of 575°–675° C., a flat surface is not attained as illustrated in FIG. 8. In this first embodiment, since the GaAs polycrystalline film 2 is grown before the growth of the InP polycrystalline film 3, the growth of the InP polycrystalline film 3 proceeds with a flat surface as shown in FIG. 9. An emissivity profile of this substrate holder is illustrated in FIG. 10. Since the flat polycrystalline film 10 is deposited on the molybdenum substrate holder 1, the emissivity of the substrate holder 1 is equal to the emissivity of molybdenum, i.e., 0.3.

According to the first embodiment of the present invention, since the GaAs polycrystalline film 2 with the flat surface is present on the surface of the molybdenum substrate holder 1, the growth of InP or InGaAsP crystal on the film 2 proceeds, forming a flat surface. Therefore, the emissivity of the molybdenum substrate holder 1 after the a crystal growth step is settled at a value near the emissivity of the wafer 7.

Using the molybdenum substrate holder of this first embodiment, a long-wavelength laser diode employing an InGaAsP mixed crystal is manufactured with good yield, improving productivity.

Figure 2:
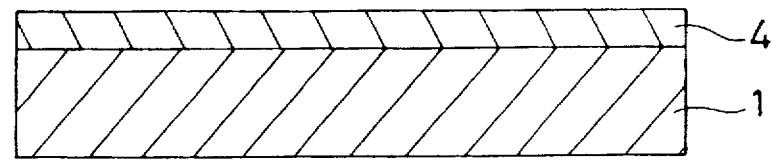
FIG. 2 is a sectional view illustrating a substrate holder of an MOCVD apparatus in accordance with a second embodiment of the present invention.

FIG. 2 is a sectional view illustrating a part of a molybdenum substrate holder for MOCVD other than a part where a wafer is mounted, in accordance with a second embodiment of the present invention. In this second embodiment, an InGaAsP polycrystalline film 4, for example, an $In_{0.71}Ga_{0.29}As_{0.63}P_{0.37}$ film, is directly grown on the surface of the molybdenum substrate holder 1 to a thickness of 0.3 µm or more. Also in this second embodiment, the emissivity of the molybdenum substrate holder 1 is settled at a value near the emissivity of the wafer 7, i.e., the emissivity profile shown in FIG. 10 is attained.

Figure 3:
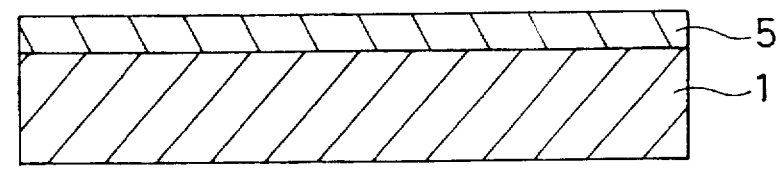
FIG. 3 is a sectional view illustrating a substrate holder of an MOCVD apparatus in accordance with a third embodiment of the present invention.

FIG. 3 is a sectional view illustrating a part of a molybdenum substrate holder for MOCVD other than a part where a wafer is mounted, in accordance with a third embodiment of the present invention. In this third embodiment, before the growth of the GaAs polycrystalline film 2 shown in FIG. 1 or before the growth of the InGaAsP polycrystalline film 4 shown in FIG. 2, the surface of the molybdenum substrate holder 1 is coated with an SiC film 5 10-500 μm thick. Also in this third embodiment, the emissivity of the molybdenum substrate holder 1 is settled at a value near the emissivity of the wafer 7, i.e., the emissivity profile shown in FIG. 10 is attained.

Figure 4:
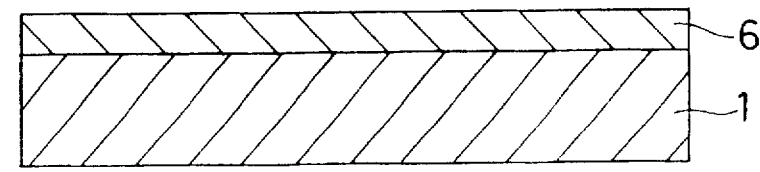
FIG. 4 is a sectional view illustrating a substrate holder of an MOCVD apparatus in accordance with a fourth embodiment of the present invention.
Figure 7:
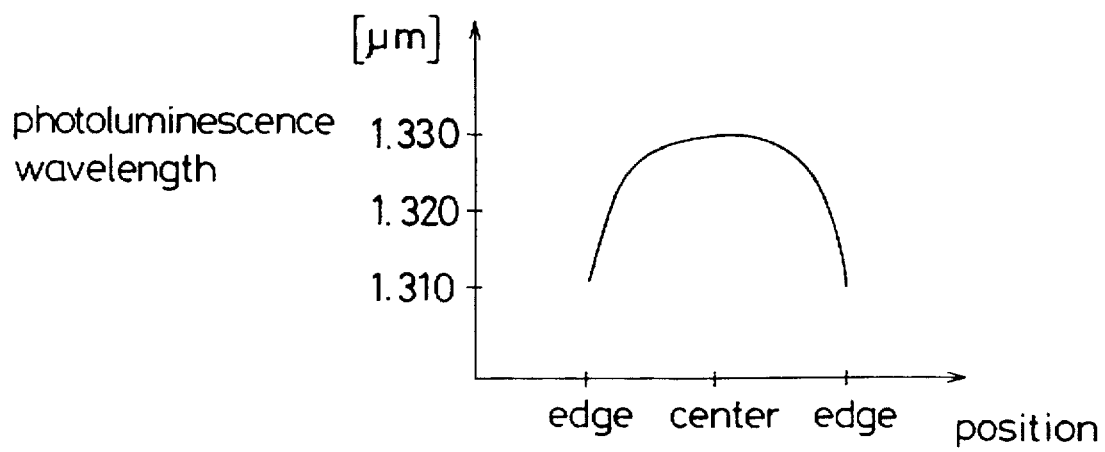
FIG. 7 is a diagram illustrating a photoluminescence wavelength profile of the semiconductor mixed crystal layer of FIG. 6.

FIG. 4 is a sectional view illustrating a part of a molybdenum substrate holder for MOCVD other than a part where a wafer is mounted, in accordance with a fourth embodiment of the present invention. In this fourth embodiment, InP is grown on the surface of the molybdenum substrate holder 1 to a thickness of 0.3 μm or more at a temperature of 400°-550° C., that is lower than the ordinary epitaxial growth temperature of 575° C., forming an InP polycrystalline film 6 with a flat surface. Also in this fourth embodiment, the emissivity of the molybdenum substrate holder 1 is settled at a value near the emissivity of the wafer 7, i.e., the emissivity profile shown in FIG. 10 is attained.

Figure 12:
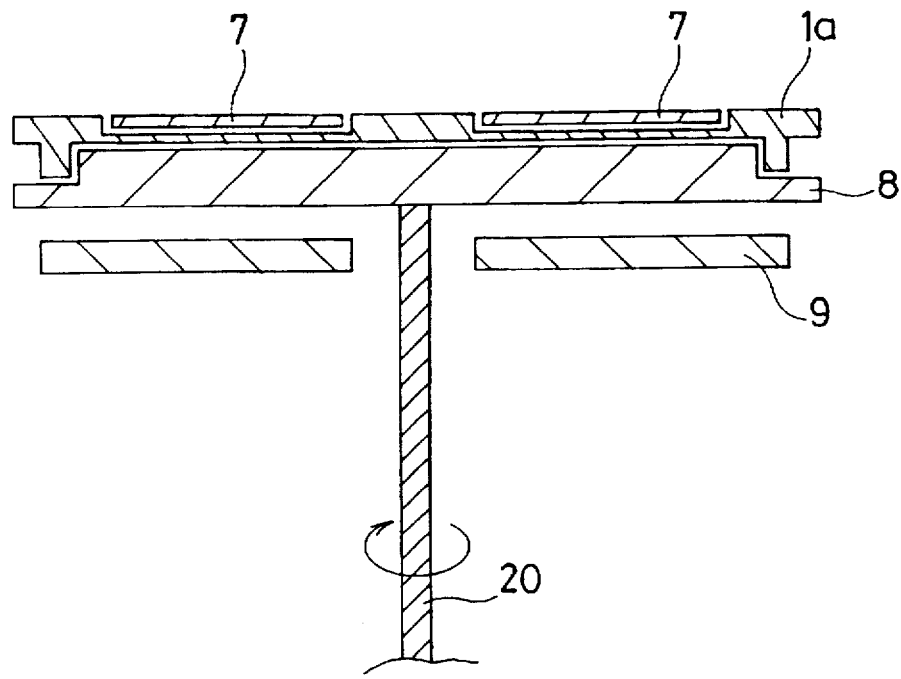
FIG. 12 is a sectional view illustrating a wafer supporting structure of an MOCVD apparatus according to the prior art, on which a plurality of wafers are processed at the same time.

FIG. 12 is a sectional view schematically illustrating a conventional susceptor with a molybdenum substrate holder on which a plurality of wafer are mounted. While in the above-described first to fourth embodiments the polycrystalline films 2, 4, and 6 and the SiC coating film 5 are formed on the molybdenum substrate holder 1 supporting only one wafer, these films may be formed on a part of the surface of the molybdenum substrate holder 1a shown in FIG. 12 where the wafers 7 are absent. Also in this case, the emissivity of the molybdenum substrate holder 1a is settled at a value near the emissivity of the wafer 7.

Figure 13:
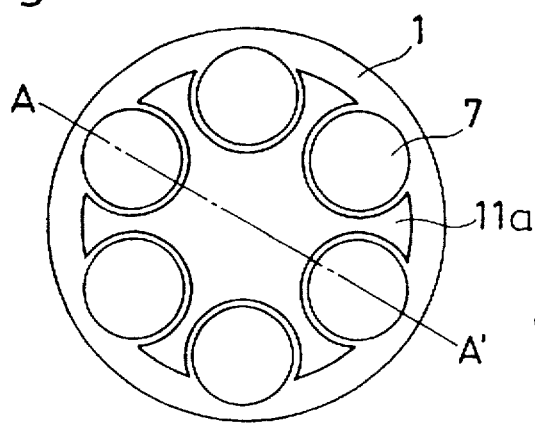
FIGS. 13(a) and 13(b) are a plan view and a sectional view illustrating a substrate holder with a cover plate in accordance with a fifth embodiment of the present invention.
FIGS. 13(c) and 13(d) are a plan view and a sectional view illustrating a substrate holder with a cover plate in accordance with a sixth embodiment of the present invention.
FIGS. 13(e) and 13(f) are a plan view and a sectional view illustrating a substrate holder with a cover plate in accordance with a seventh embodiment of the present invention.
Figure 13:
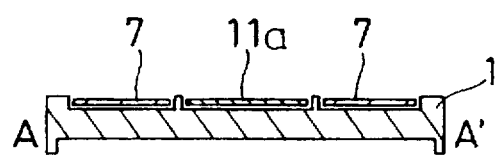
Figure 13:
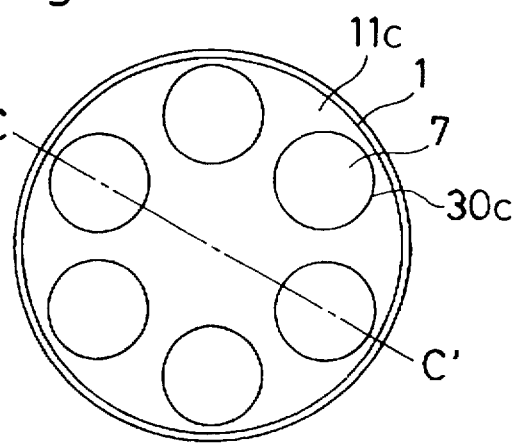
Figure 13:
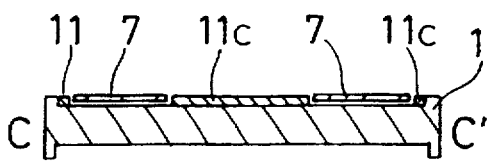
Figure 13:
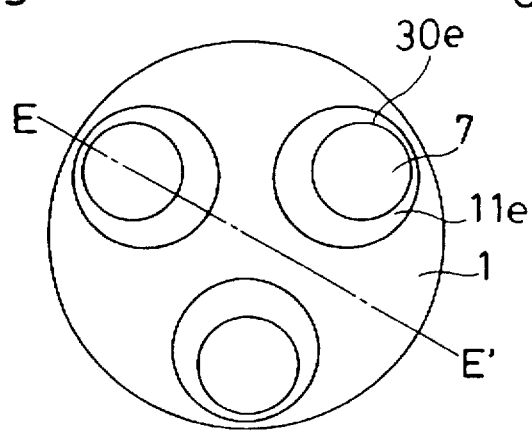
Figure 13:
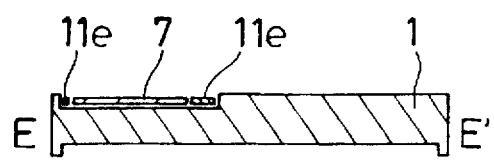

FIG. 13(a) is a plan view of a substrate holder for MOCVD supporting six 2-inch wafers in accordance with a fifth embodiment of the present invention, and FIG. 13(b) is a sectional view taken along line A-A' of FIG. 13(a).

In the figures, six 2-inch wafers 7 are mounted on a molybdenum substrate holder 1 having a diameter of 7 inches. A part of the surface of the substrate holder 1 is covered with a plate 11a comprising a monocrystalline compound semiconductor or a polycrystalline compound semiconductor (hereinafter referred to as cover plate). The cover plate 11a surrounds five-eighths of the periphery of each wafer 7.

While in the above-described first to fourth embodiments the polycrystalline films and the SiC coating film are directly formed on the molybdenum substrate holder 1, in this fifth embodiment these films are formed on the cover plate 11a.

FIG. 13(c) is a plan view of a substrate holder in accordance with a sixth embodiment of the present invention, and FIG. 13(d) is a sectional view taken along line C-C' of FIG. 13(c).

In this sixth embodiment, a compound semiconductor monocrystalline or polycrystalline cover plate 11c as large as the substrate holder 1 is disposed on the substrate holder 1. The cover plate 11c has six apertures 30c through which six 2-inch wafers 7 are mounted on the surface of the substrate holder 1. Each aperture 30c is as large as the 2-inch wafer 7.

FIG. 13(e) is a plan view of a substrate holder according to a seventh embodiment of the present invention, and FIG. 13(f) is a sectional view taken along line E-E' of FIG. 13(e).

In this seventh embodiment, three cover plates 11e, each having an aperture 30e, are disposed on the substrate holder 1. A wafer 7 is disposed on the substrate holder 1 through the aperture 30e of the cover plate 11e.

In the above-described fifth to seventh embodiments, the cover plate 11a, 11c, or 11e is disposed on the substrate holder 1, and the polycrystalline film or the SiC coating film according to the first to fourth embodiments of the present invention is formed on the cover plate. Therefore, the uniformity of the decomposition ratio of the source gas on the wafer is improved compared to the first to fourth embodiments of the present invention, improving the uniformity of the composition in the crystal layer grown on the wafer.

Figure 14:
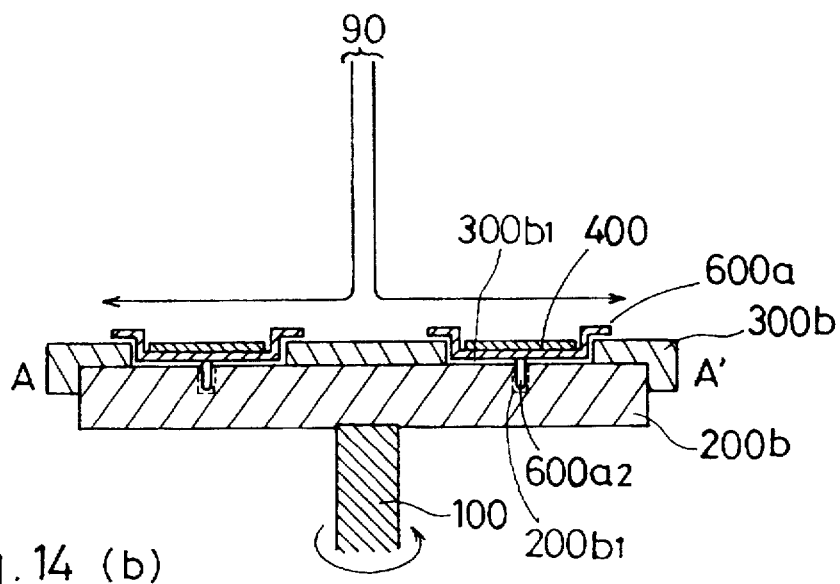
FIGS. 14(a) and 14(b) are a sectional view and a plan view illustrating a wafer supporting structure of an MOCVD apparatus in accordance with an eighth embodiment of the present invention.
FIGS. 14(c) and 14(d) are a sectional view and a plan view of a wafer tray included in the wafer supporting structure.
Figure 14:
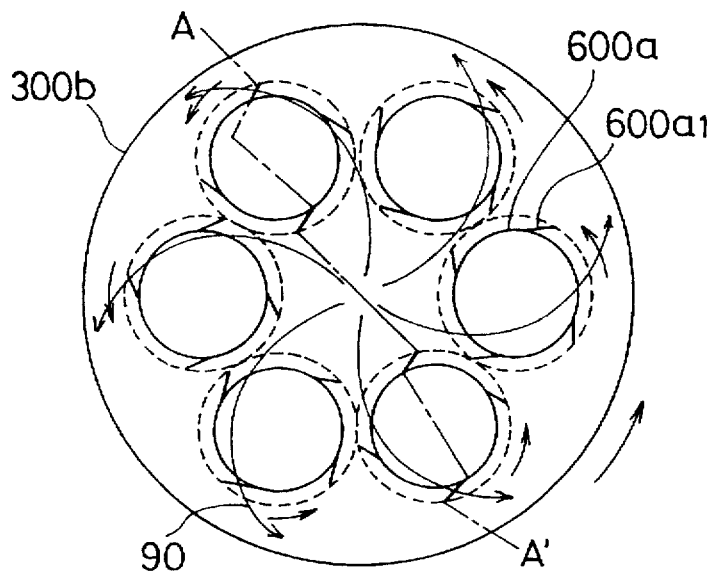
Figure 14:
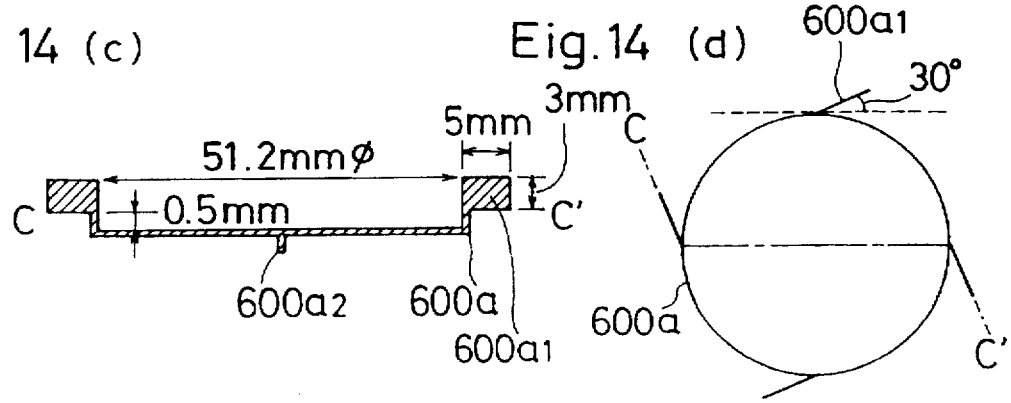

FIGS. 14(a) and 14(b) are a sectional view and a plan view illustrating a substrate holder on a susceptor of an MOCVD apparatus in accordance with an eighth embodiment of the present invention. FIGS. 14(c) and 14(d) are a sectional view and a plan view illustrating a wafer tray disposed on the substrate holder.

In the figures, a substrate holder 300b having six apertures $300b_1$ is disposed on a susceptor 200b. The susceptor 200b is supported by a rotation axle 100. Six wafer trays 600a are mounted on the susceptor 200b through the apertures $300b_1$. Each wafer tray 600a has an axle $600a_2$ on its rear surface, which is fitted in a small axle hole $200b_1$ of the susceptor 200b. The diameter of the wafer tray 600a on which a 2-inch wafer 400 is to be mounted is 51.2 mm. Four wings $600a_1$ are arranged on the periphery of the wafer tray 400. Each wing is 5 mm×3 mm in size, and the space between the rear surface of the wafer tray and the lower edge of the wing is 0.5 mm. The wing forms an angle of 30° with a tangent line of the circumference of the wafer tray.

A description is given of the operation.

Figure 20:
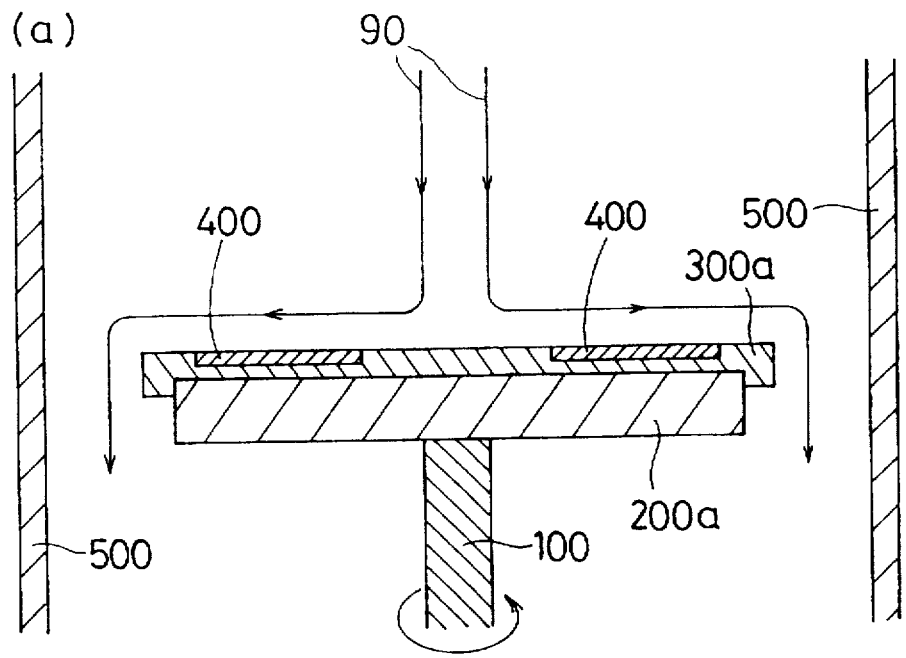
FIGS. 20(a) and 20(b) are diagrams for explaining the direction of source gas flow in the MOCVD apparatus of FIGS. 19(a)–19(b).
Figure 20:
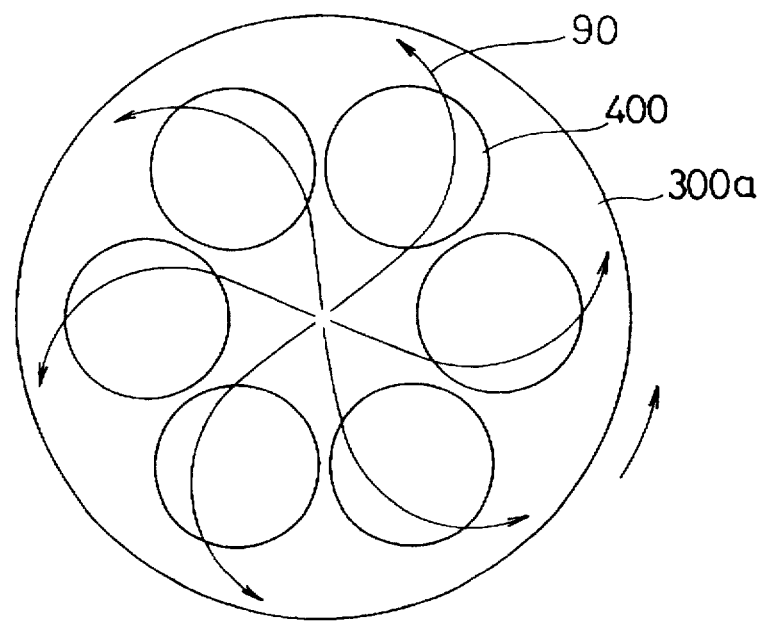

When the susceptor 200b rotates at a high speed of 1000 rpm, the source gas introduced into the reactor, such as $AsH_3$, TMG, or $H_2$, flows toward the center of the substrate holder 300b at a maximum speed of 60 cm/sec and radially spreads toward the edge of the substrate holder 300b parallel to the surface of the substrate holder. Since the susceptor 200b rotates counterclockwise at the high speed, the source gas flows while whirling with the rotation of the susceptor 200a as shown in FIG. 20(b). The source gas whirling above the wafers 400 mounted on the wafer trays 600a hits the four wings $600a_1$ of each wafer tray, whereby a torque is applied to the wafer tray 600a and the wafer tray turns on the axle $600a_2$. The rotation speed of the wafer tray is not specified so long as it rotates on the susceptor 200b.

Figure 21:
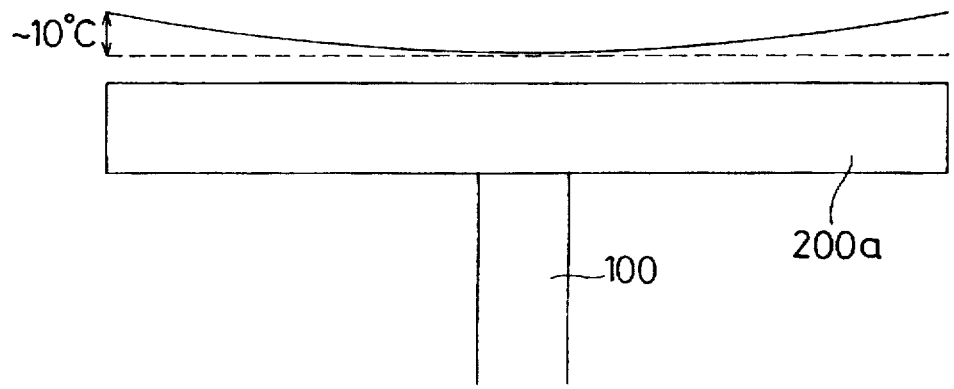
FIG. 21 is a schematic diagram illustrating a temperature gradient on a susceptor according to the prior art.
Figure 22:
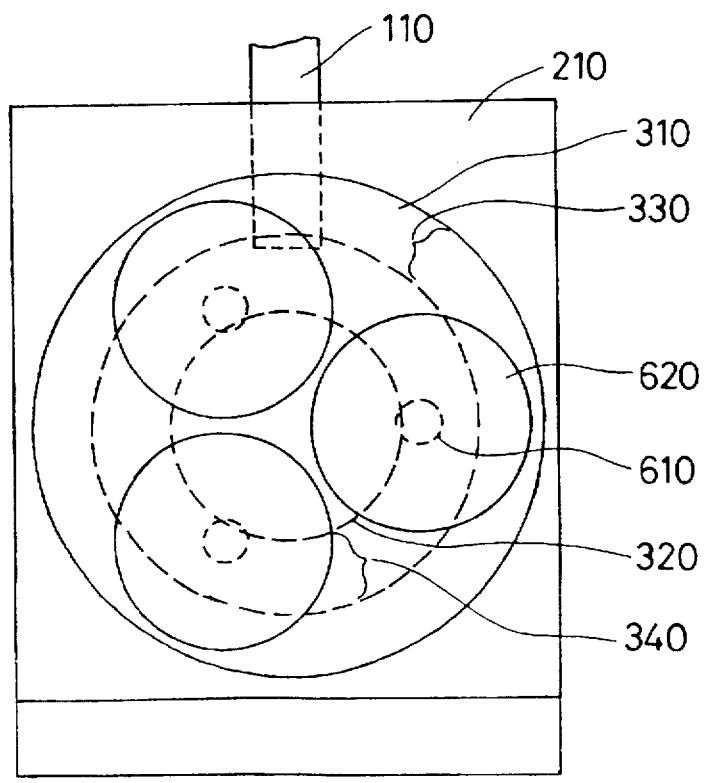
FIG. 22 is a plan view illustrating a susceptor supporting a plurality of wafers, on which each wafer turns on its own axle and rotates around an axle of the susceptor, according to the prior art.

When a GaAs layer is grown on each of the wafers 400, the susceptor 200b is heated to a desired temperature, for example, 700°, by resistance heating, lamp heating, or RF heating, and TMG gas is introduced into the reactor. The temperature gradient on the susceptor 200b at this time is shown in FIG. 21. That is, the temperature in the vicinity of the edge of the susceptor is higher than the temperature in the center and, therefore, the heat applied to the source gas flow gradually increases in the downstream direction of the source gas flow. In this eighth embodiment, however, since the wafer 400 on the wafer tray 600a rotates as described above, the position of the wafer 400 relative to the source gas flow is shifted all the time during crystal growth, whereby the growth of the GaAs layer proceeds uniformly over the wafer.

According to the eighth embodiment of the present invention, in addition to the high-speed rotation of the susceptor 200b which revolves the six wafers 400 around the axle 100, each wafer on the wafer tray 600a is rotated on the axle $600a_2$ of the wafer tray. During crystal growth, the rotation of the susceptor makes the residence time of the source gas longer, increasing the decomposition ratio of the source gas. The rotation of each wafer shifts the position of the wafer relative to the source gas flow all the time so that the difference in the decomposition ratios of the source gas between the upstream part and the downstream part of the source gas flow is reduced. Therefore, a crystal layer with uniform thickness, composition, and carrier density over the wafer 400 is attained regardless of the direction of the gas flow.

Figure 15:
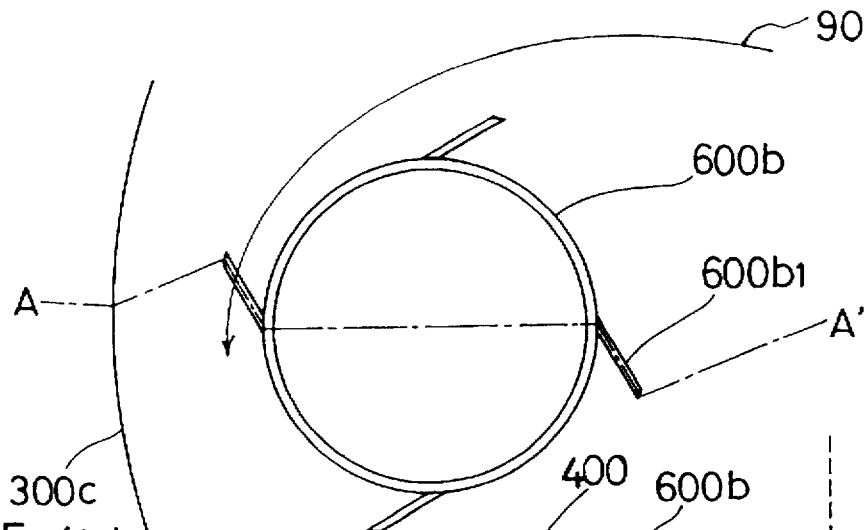
FIGS. 15(a) and 15(b) are a plan view and a sectional view illustrating a wafer supporting structure of an MOCVD apparatus in accordance with a ninth embodiment of the present invention.
FIG. 15(c) is a plan view illustrating a part of the structure.
Figure 15:
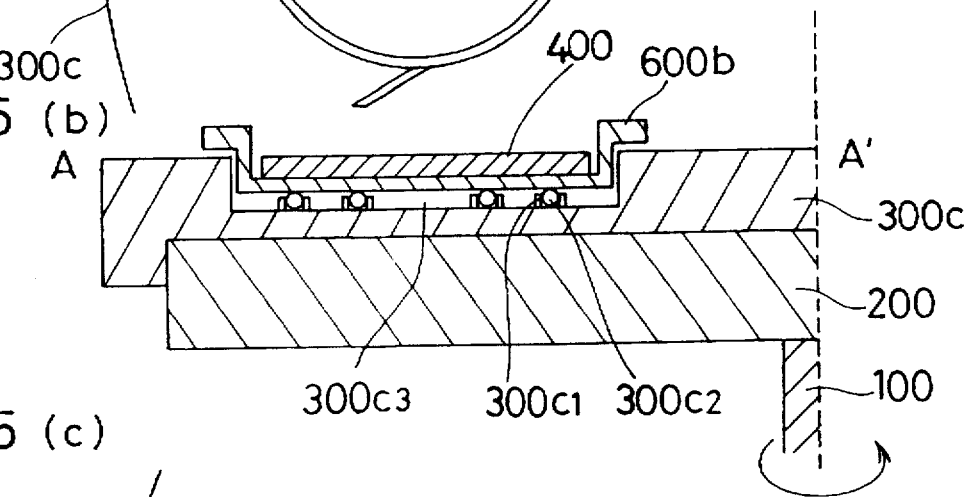
Figure 15:
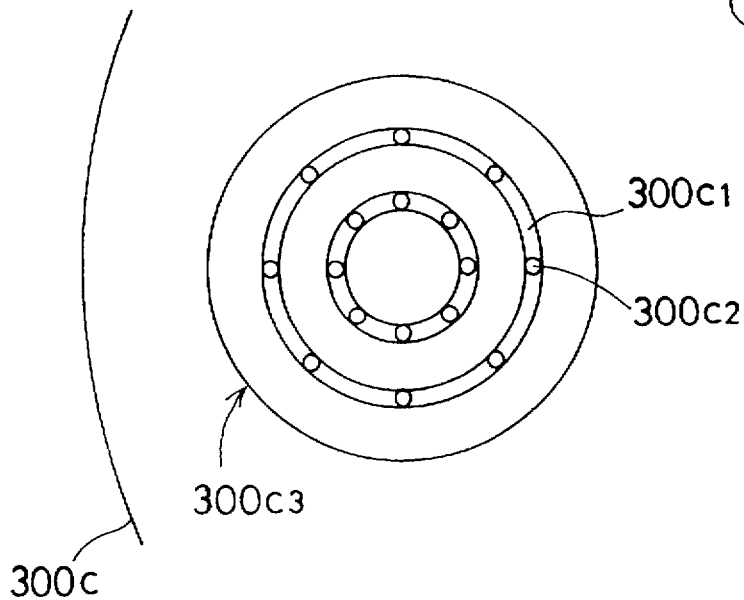

FIG. 15(a) is a plan view illustrating a wafer tray on a substrate holder of an MOCVD apparatus in accordance with a ninth embodiment of the present invention. FIG. 15(b) is a sectional view taken along line A–A' of FIG. 15(a), and FIG. 15(c) is a plan view of a part of the substrate holder.

In the figures, reference numeral 200 designates a susceptor having a rotation axle 100. A substrate holder 300c having a diameter of 7 inches is disposed on the susceptor 200. A cavity $300c_3$ is formed on the surface of the substrate holder 300c. A bearing mechanism comprising two annular grooves $300c_1$ and a plurality of balls $300c_2$ inserted in the grooves $300c_1$ is disposed on the flat surface of the cavity $300c_3$. The balls $300c_2$ comprise a heat resistant material, such as SiC (silicon carbide) or molybdenum. A 2-inch wafer 400 is mounted on a wafer tray 600b of the same size as the wafer tray 600a shown in FIG. 14(c). The wafer tray 600b has four wings $600b_1$ on its periphery. The wafer tray 600b is set in the cavity $300c_3$ of the substrate holder 300c so that the rear surface of the wafer tray is in contact with the bearing mechanism.

A description is given of the operation.

When the source gas whirling above the substrate holder 300c with the rotation of the susceptor 200 hits the four wings 600b, of the wafer tray 600b, a torque is applied to the wafer tray 600b, whereby the wafer tray rotates on the bearing mechanism, i.e., rotation of the wafer 400 is achieved.

According to the ninth embodiment of the present invention, in addition to the high-speed rotation of the susceptor 200b which revolves the wafer 400 around the axle 100, the rotation of the wafer is achieved by the wafer tray 600b rotating on the bearing mechanism. Therefore, during crystal growth, the rotation of the susceptor 200b makes the residence time of the source gas on the wafer longer, increasing the decomposition ratio of the source gas. The rotation of the wafer relative 400 shifts the position of the wafer to the source gas flow all the time, whereby the difference in the source gas decomposition ratios between the upstream part and the downstream part of the source gas flow is reduced. Therefore, a crystal layer with uniform thickness, composition, and carrier density over the wafer 400 is attained regardless of the direction of the gas flow.

Figure 16:
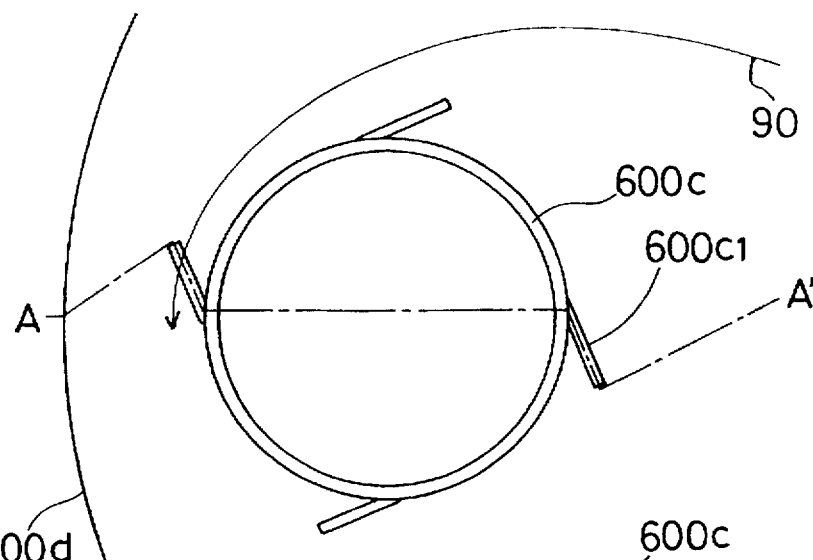
FIGS. 16(a) and 16(b) are a plan view and a sectional view illustrating a wafer supporting structure of an MOCVD apparatus in accordance with a tenth embodiment of the present invention.
FIG. 16(c) is a plan view illustrating a part of the structure.
Figure 16:
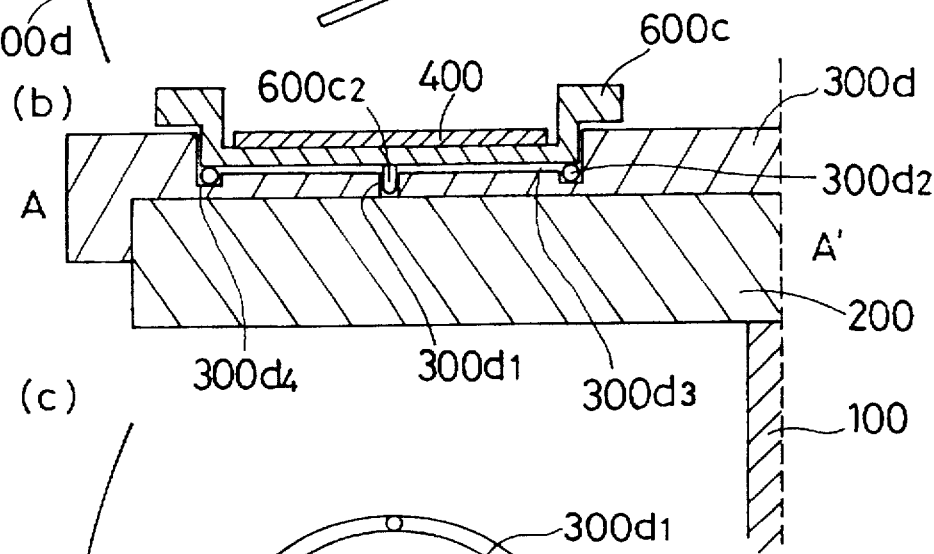
Figure 16:
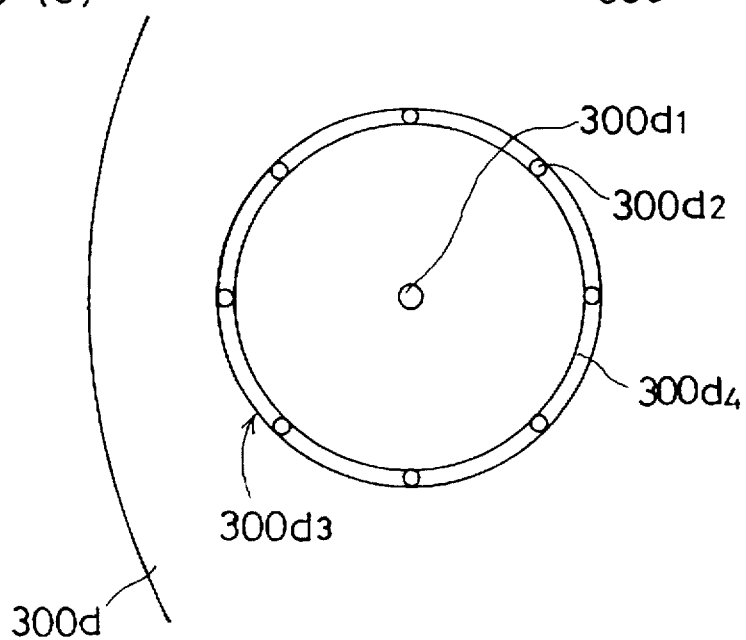

FIG. 16(a) is a plan view illustrating a wafer tray on a substrate holder in accordance with a tenth embodiment of the present invention. FIG. 16(b) is a sectional view taken along line A–A' of FIG. 16(a), and FIG. 16(c) is a plan view illustrating a part of the substrate holder.

In the figures, a substrate holder 300d having a diameter of 7 inches is disposed on the susceptor 200. A cavity $300d_3$ is formed on the surface of the substrate holder 300d, and a small axle hole $300d_1$ is formed in the center of the cavity $300d_3$. An annular groove $300d_4$ is formed along the periphery of the cavity $300d_3$, and a plurality of balls $300d_2$ comprising a heat resistant material, such as SiC or molybdenum, are inserted in the groove $300d_4$. A 2-inch wafer 400 is disposed on a wafer tray 600c of the same size as the wafer tray 600a shown in FIG. 14(c). The wafer tray 600c has four wings $600c_1$ on its periphery and a rotation axle $600c_2$ in the center of its rear surface. The wafer tray 600c is set in the cavity $300d_3$ of the substrate holder 300d so that the axle $600c_2$ is fitted in the axle hole $300d_1$ and the rear surface of the wafer tray is in contact with the bearing mechanism comprising the annular groove $300d_4$ and the balls $300d_2$.

A description is given of the operation.

When the source gas whirling above the substrate holder 300d with the rotation of the susceptor 200 hits the four wings $600c_1$ of the wafer tray 600c, a torque is applied to the wafer tray, whereby the wafer tray rotates on the axle $600c_2$. The bearing mechanism makes the rotation of the wafer tray 600c smooth.

Also in this tenth embodiment, the high-speed rotation of the susceptor 200 provides the revolution of the wafer 400 around the axle 100 and the wafer tray 600c provides the rotation of the wafer 400 on the axle $600c_2$, whereby the same effects as described in the eighth and ninth embodiments are attained.

Figure 17:
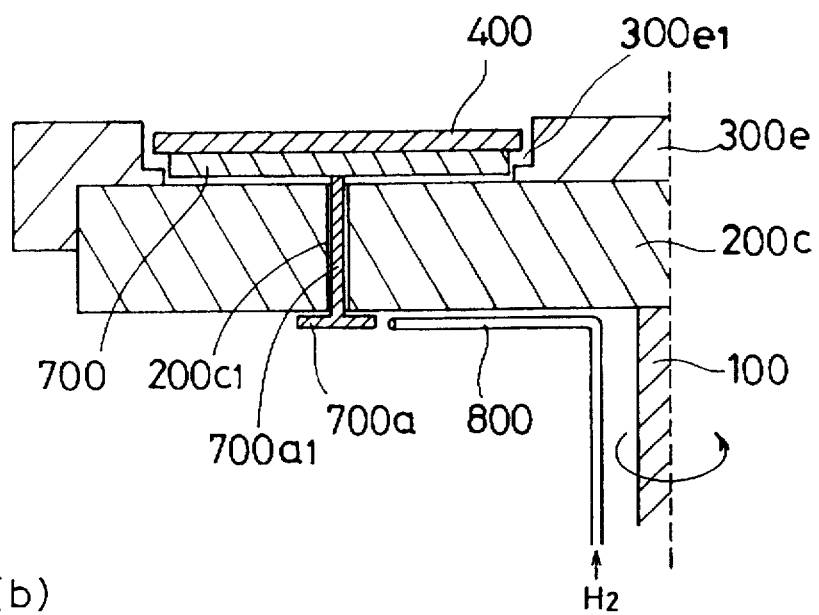
FIG. 17(a) is a sectional view illustrating a wafer supporting structure of an MOCVD apparatus in accordance with an eleventh embodiment of the present invention.
FIG. 17(b) is a plan view illustrating the rear of the structure.
Figure 17:
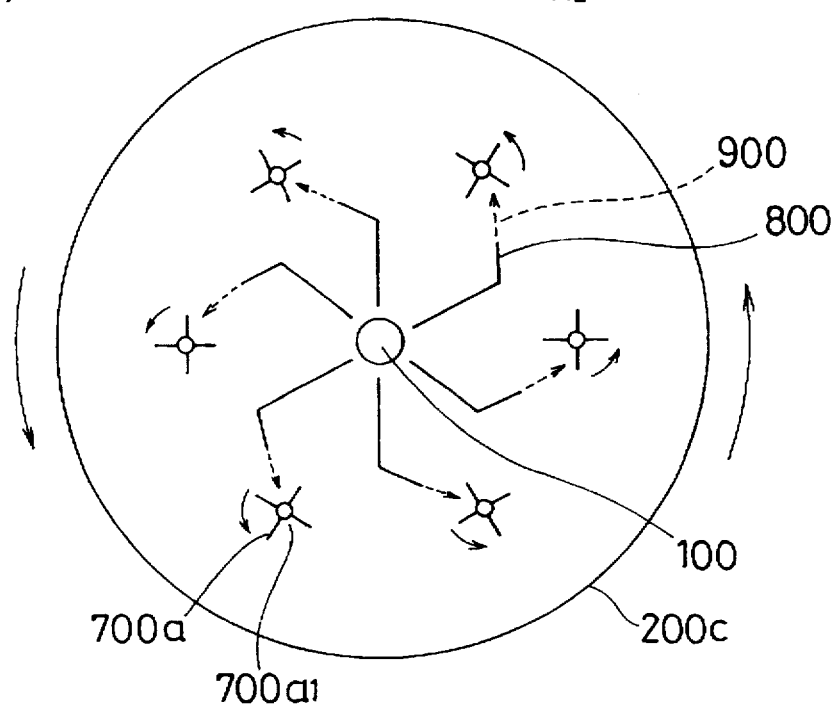

FIG. 17(a) is a sectional view illustrating a part of a wafer supporting structure included in an MOCVD apparatus in accordance with an eleventh embodiment of the present invention, and FIG. 17(b) is a bottom plan view of a rotating susceptor of the wafer supporting structure.

In the figures, a susceptor 200c has six cylindrical holes $200c_1$ and a rotation axle 100. A substrate holder 300e is disposed on the susceptor 200c. A wafer tray 700 supporting a wafer 400 is set in an aperture $300e_1$ of the substrate holder 300e and mounted on the surface of the susceptor 200c. The wafer tray 700 has a rotation axle $700a_1$, in the center of its rear surface. The axle $700a_1$, penetrates through each cylindrical hole 200c of the susceptor 200c and has four wings 700a on the rear surface of the susceptor 200c. A gas supply pipe 800 is disposed in the vicinity of the wings 700a of the wafer tray 700, and $H_2$ gas is applied to the wings 700a through the gas supply pipe 800, whereby the wafer tray 700 turns on the axle $700a_1$. The dotted lines 900 in FIG. 17(b) schematically illustrate the $H_2$ gas flow.

A description is given of the operation.

Since the wafer tray 700 on the rotatable susceptor 200c has the rotation axle $700a_1$ penetrating through the susceptor 200c and the four wings 700a at an end of the axle $700a_1$ opposite to the end of and in contact with the wafer tray 700, when the $H_2$ gas is applied through the gas pipe 800 to the wings 700a, the wafer tray 700 turns on the axle $700a_1$.

According to the eleventh embodiment of the present invention, the high-speed rotating susceptor 200c provides the revolution of the wafer 400 around the axle 100 and the wafer tray 700 provides the rotation of the wafer 400 on the axle $700a_1$. During the crystal growth process, the position of the wafer 400, on which the crystal growth proceeds, relative to the source gas flow, shifts all the time. Therefore, even if the decomposition ratio of the source gas varies between the upstream part and downstream part of the source gas flow, a crystal layer with uniform thickness, composition, and carrier density over the wafer 400 is attained regardless of the direction of the source gas flow.

Figure 18:
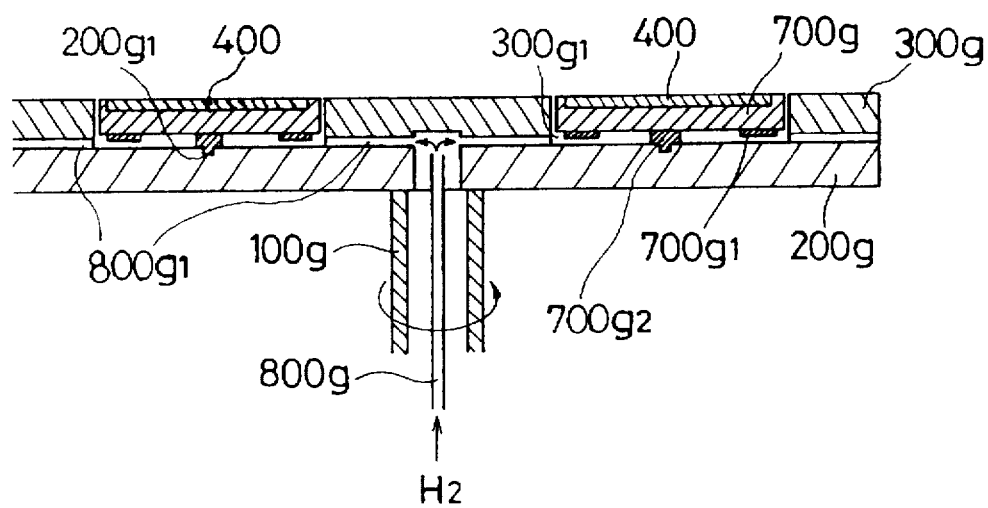
FIG. 18(a) is a sectional view illustrating a wafer supporting structure of an MOCVD apparatus in accordance with a twelfth embodiment of the present invention.
FIG. 18(b) is a bottom plan view of a wafer tray included in the structure.
Figure 18:
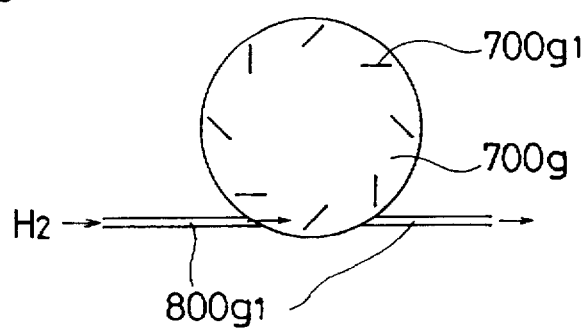
Figure 19:
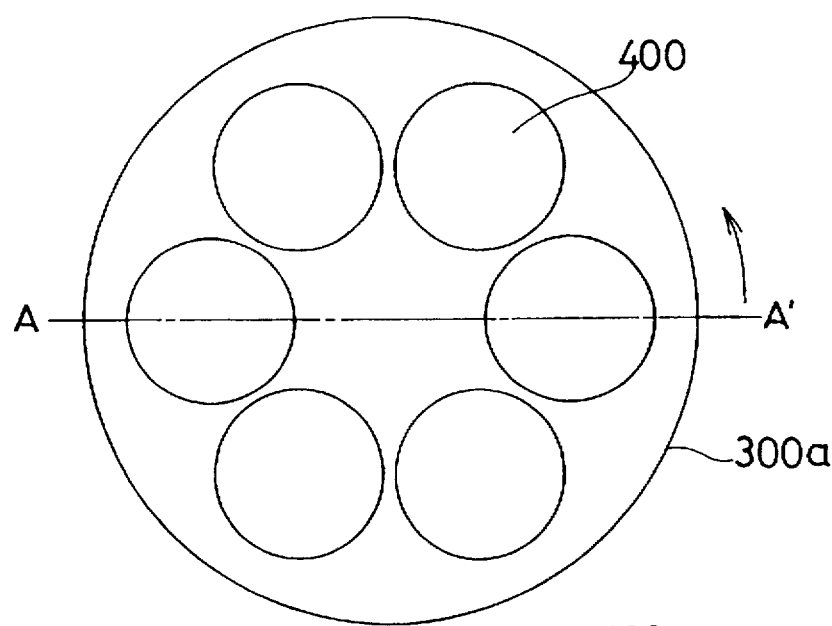
FIGS. 19(a) and 19(b) are a plan view and a sectional view illustrating a wafer supporting structure of an MOCVD apparatus in accordance with the prior art.
Figure 19:
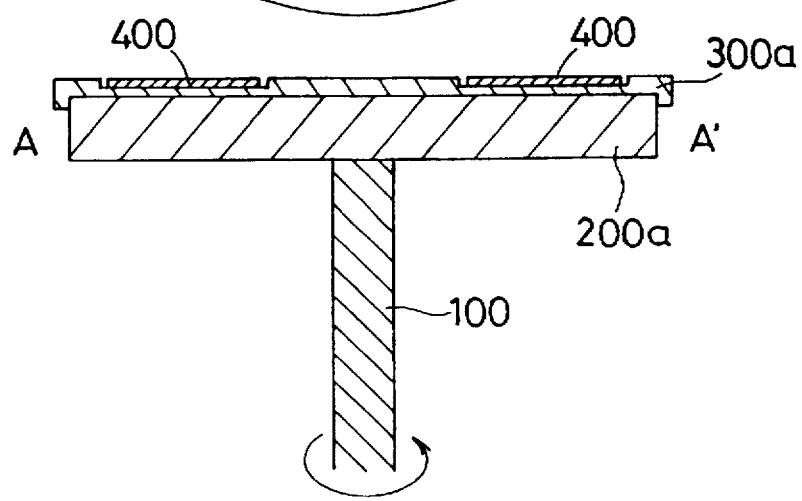

FIG. 18(a) is a sectional view illustrating a wafer supporting structure of an MOCVD apparatus in accordance with a twelfth embodiment of the present invention, and FIG. 18(b) is a bottom plan view of a wafer tray included in the structure.

In the figures, a susceptor 200g has six axle holes $200g_1$ on the front surface and an rotation axle 100g in the center of the rear surface. A substrate holder 300g having six apertures 300g₁ is disposed on the susceptor 200g. Six wafer trays 700g each supporting a wafer 400 are mounted on the susceptor 200g through the apertures 300g₁ of the substrate holder 300g. Each wafer tray 700g has an axle 700g₂ and eight wings 700g₁ on the rear surface. An axle 700g₂ is fitted in each axle hole 200g. of the susceptor 200g. A gas supply pipe 800g is arranged inside the rotation axle 100g. Six gas passages 800g₁ are radially disposed between the substrate holder 300g and the susceptor 200g. each one connecting to the space beneath each of the six wafer trays 700g.

A description is given of the operation.

The H₂ gas introduced through the gas pipe 800g into the space between the substrate holder 300g and the susceptor 200g flows through each of the six gas passages 800g₁. Since the gas passage 800g₁ is connected to the space between the wafer trays 700g and the susceptor 200g, the H₂ gas flowing through the gas passage 800g₁ is applied to the wings 700g₁ on the rear surface of the wafer trays 700g, whereby each wafer tray 700g turns on the axle 700g₂.

Also in this twelfth embodiment of the present invention, the same effects as in the above-described eighth to eleventh embodiments are achieved.

What is claimed is:

1. A substrate holder for metal organic chemical vapor deposition comprising:

a molybdenum holder body having a front surface for supporting a compound semiconductor wafer smaller than the body and to which source gases are applied and a rear surface;

an SiC film disposed on a part of the front surface of the molybdenum holder body not covered by a compound semiconductor wafer supported by the holder;

a GaAs polycrystalline film disposed on the SiC film and having a thickness of at least 0.3 μm; and an InP polycrystalline film disposed on said GaAs polycrystalline film and having a thickness of at least 0.3 μm.

2. A substrate holder for metal organic chemical vapor deposition comprising:

a molybdenum holder body having a front surface for supporting a compound semiconductor wafer smaller than the body and to which source gases are applied and a rear surface;

an SiC film disposed on a part of the front surface of the molybdenum holder body not covered by a compound semiconductor wafer supported by the holder; and an InGaAs polycrystalline film disposed on the SiC film and having a thickness of at least 0.3 μm.

* * * * *